(12) United States Patent
Joseph et al.

(10) Patent No.: US 6,529,394 B1
(45) Date of Patent: Mar. 4, 2003

(54) INVERTER FOR AN ELECTRIC MOTOR

(75) Inventors: Craig Joseph, Santa Clara, CA (US);
Kelly W. Arnold, Santa Clara, CA (US)

(73) Assignee: United Defense LP, Arlington, VA (US)

( * ) Notice: Subject to any disclaimer, the term of this patent is extended or adjusted under 35 U.S.C. 154(b) by 0 days.

(21) Appl. No.: 09/708,182

(22) Filed: Nov. 7, 2000

(51) Int. Cl.[7] ............................................... H02M 1/10
(52) U.S. Cl. ..................... 363/141; 363/145; 363/147; 361/689; 361/69
(58) Field of Search ............................. 363/141, 147, 363/144, 145; 361/689, 699, 704, 707, 710; 165/80.6

(56) References Cited

U.S. PATENT DOCUMENTS

| | | | | |
|---|---|---|---|---|
| 4,754,607 A | * | 7/1988 | Mackay ........................ | 60/237 |
| 5,184,291 A | * | 2/1993 | Crowe et al. .................. | 363/37 |
| 5,631,821 A | * | 5/1997 | Muso .......................... | 363/141 |
| 5,923,135 A | * | 7/1999 | Takeda ........................ | 318/432 |
| 6,000,912 A | * | 12/1999 | Takada et al. ................. | 417/32 |
| 6,118,238 A | * | 9/2000 | Munro et al. ................ | 318/141 |

\* cited by examiner

*Primary Examiner*—Bao Q. Vu
(74) *Attorney, Agent, or Firm*—The Kline Law Firm (57) ABSTRACT

An oil-cooled inverter for an electric traction motor that uses six IGBT switches to generate 3-phase AC electrical current as its output. The switches are mounted on heat sinks that use hot motor oil (hydraulic fluid) as the heat transfer fluid. An interior of each of the heat sinks contains a heat transfer medium. The heat sink housing is made of molybdenum, which has a thermal expansion rate equal to that of silicon. This allows the circuitry of the inverter to be mounted directly on the top surface of the heat sinks, as the expansion and contraction of the heat sink housing will match that of the silicon substrate of the chips. Since both elements, the heat sink housing and the chip substrate, expand and contract at an equal rate during heating and cooling, the problem of the chip substrate cracking and breaking due to thermal flexing is eliminated. The inverter is in most ways electrically equivalent to prior art inverters, but the upper surface formed by the bank of heat sinks is electrically hot, and is used as part of the inverter circuitry. This allows the elimination of the insulating plate on which the inverter circuitry is normally mounted, as the chips of the inverter circuitry are mounted directly on the upper surface of the heat sinks of the inverter.

9 Claims, 13 Drawing Sheets

INVERTER FOR AN ELECTRIC MOTOR

FIELD OF THE INVENTION

The present invention relates generally to an inverter for an electric traction motor, and more particularly is an improved inverter with a heat sink that utilizes oil (hydraulic fluid) as the heat transfer fluid.

BACKGROUND OF THE INVENTION

Traction vehicles, such as locomotives or high power off-road vehicles, are driven by electrically powered traction motors which drive the wheels of the vehicle. The traction motors operate on AC power, but the power generated by the motor of the vehicle is DC. The DC potential generated by the motor must therefore be converted from DC to AC current in an inverter. The electric power generation/inversion requires the use of multiple semiconductor devices, and switches to control the semiconductor devices, all of which generate a great deal of heat. To dissipate the heat produced in the inverter, current art vehicles use either water or air cooling systems, or both in combination. These current art methods of cooling lead to several problems.

For any device to be air cooled, there must be adequate space around the device for air to flow in sufficient volume to remove the heat. Since traction motor applications typically utilize three-phase AC current, six IGBT (insulated gate bipolar transistor) switches must be employed. The power requirements of the motors require that a capacitor bank be present in the inverter, along with the accompanying sensors, etc. The number of components required mandates a significant space requirement which is greatly exaggerated due to the need for space to accommodate air flow around the inverter.

In direct contradiction to the need for open space for cooling air flow is the fact that electrical devices function best in enclosed, non-ventilated environments. This kind of environment reduces the potential of contaminant buildup. Contaminant buildup can not only impede the desired heat transfer, but may also cause an electrical failure of the device. Therefore air cooling directly creates a situation detrimental to the function of the electrical device, in this case an inverter.

Because of the problems caused by air cooling, some current art devices utilize water cooling in the inverter. Water cooled inverters can operate in a more controlled environment, but the water cooling system is generally not readily available. Motors in vehicles of the class which is the subject of this invention, those that utilize electrically powered traction wheels, are usually oil cooled. Thus, utilization of an inverter that requires water cooling leads to the necessity of including a water cooling system in a motor that would not otherwise have it. Still more space is therefore required.

Because of the size requirements demanded by the cooling systems of current art inverters, the inverter comprises a large unit contained in a compartment dedicated only to the inverter. This necessitates that lead wires for control and feedback systems must be fairly long, typically anywhere from 2 to 10 feet. Longer wires are by necessity heavier than shorter wires, both in terms of weight and electrical rating. Longer wires significantly increase the potential for distorted signals.

Accordingly, it is an object of the present invention to provide an inverter for an electric traction motor that utilizes the same cooling system used for the motor.

It is a further object of the present invention to provide an inverter that has significantly reduced space requirements.

It is a still further object of the present invention to provide an inverter that can be formed with generally planar components, thereby reducing inductance of the inverter.

SUMMARY OF THE INVENTION

The present invention is an oil-cooled inverter for an electric traction motor. The inverter comprises six IGBT switches to generate 3-phase AC electrical current as its output. The switches are mounted on heat sinks that use hot motor oil (hydraulic fluid) as the heat transfer fluid. An interior of each of the heat sinks contains a heat transfer medium. In the preferred embodiment, the heat transfer medium is a plurality of silver plated copper balls. The copper balls are brazed to each other and to the walls of the heat sinks in an assembly process. The heat sink housing is made of molybdenum, which has a thermal expansion rate equal to that of silicon. This allows the circuitry of the inverter to be mounted directly on the top surface of the heat sinks, as the expansion and contraction of the heat sink housing will match that of the silicon substrate of the chips. Since both elements, the heat sink housing and the chip substrate, expand and contract at an equal rate during heating and cooling, the problem of the chip substrate cracking and breaking due to thermal flexing is eliminated.

The IGBT switch/heat sink assemblies are mounted in a planar fashion in a laminated bus device. The bus device also houses a bank of capacitors for the inverter. The structure of the bus device allows the IGBT switches and the capacitors of the inverter to be assembled as generally planar elements, thereby reducing inductance of the device. This allows the switches to function more efficiently.

The inverter of the present invention is in most ways electrically equivalent to prior art inverters. One key exception is that the upper surface formed by the bank of heat sinks is electrically hot, and is used as part of the circuitry. This allows the elimination of the insulating plate on which the inverter circuitry is normally mounted, as the chips of the inverter circuitry of the present invention are mounted directly on the upper surface of the heat sinks of the inverter.

One of the chief advantages of the present invention is that it greatly reduces the space required for the inverter in the engine compartment of the vehicle. The inverter module of the present invention requires only 10% the amount of space required by the inverter module of the inventors' current art. The weight of the inverter module of the present invention is also greatly reduced, being only 20% of that of the current art. This tremendous reduction in size and weight leads to the added benefit of making the inverter module far less expensive and more practical to "spare", that is, to stock an entire inverter module for repair use.

Another advantage of the present invention is that the reduced size and compact assembly of the inverter allows it to be mounted directly to the motor (generator). This significantly reduces the length of the lead wires of the feedback and control systems.

A still further advantage of the present invention is that it utilizes the same coolant supply system as does the electric motor of the vehicle, thereby eliminating the necessity of a water cooling system.

Yet another advantage of the inverter of the present invention is that the chips of the inverter circuitry are mounted directly on the surface of the heat sink, thereby eliminating components and space requirements. The surface of the heat sinks is electrically hot, and serves as part of the circuitry.

Still another advantage of the present invention is that the planar structure reduces inductance in the inverter.

These and other objects and advantages of the present invention will become apparent to those skilled in the art in view of the description of the best presently known mode of carrying out the invention as described herein and as illustrated in the drawings.

DETAILED DESCRIPTION OF THE INVENTION

Figure 1:
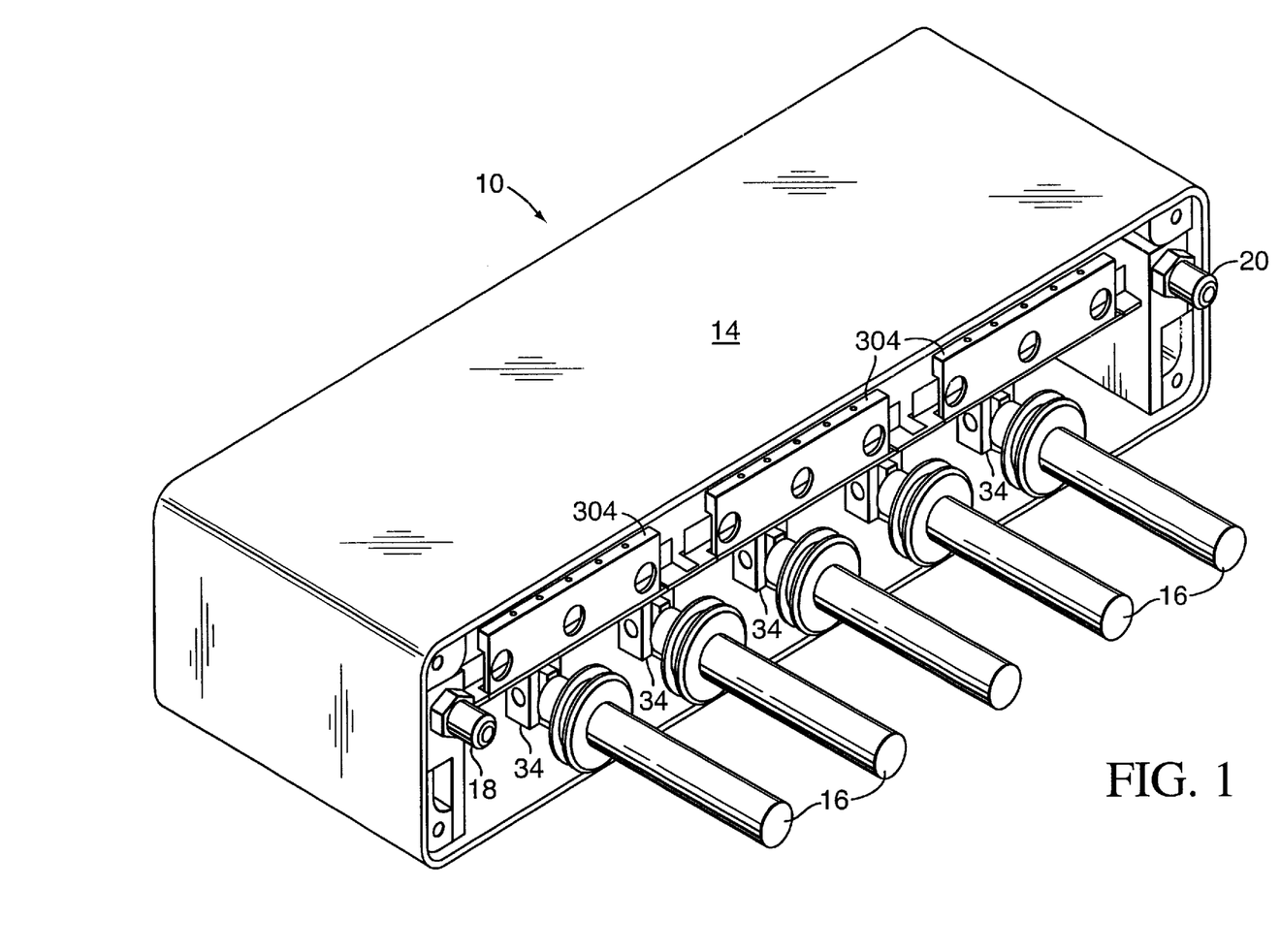
FIG. 1 is a perspective view of the inverter module of the present invention.
Figure 2:
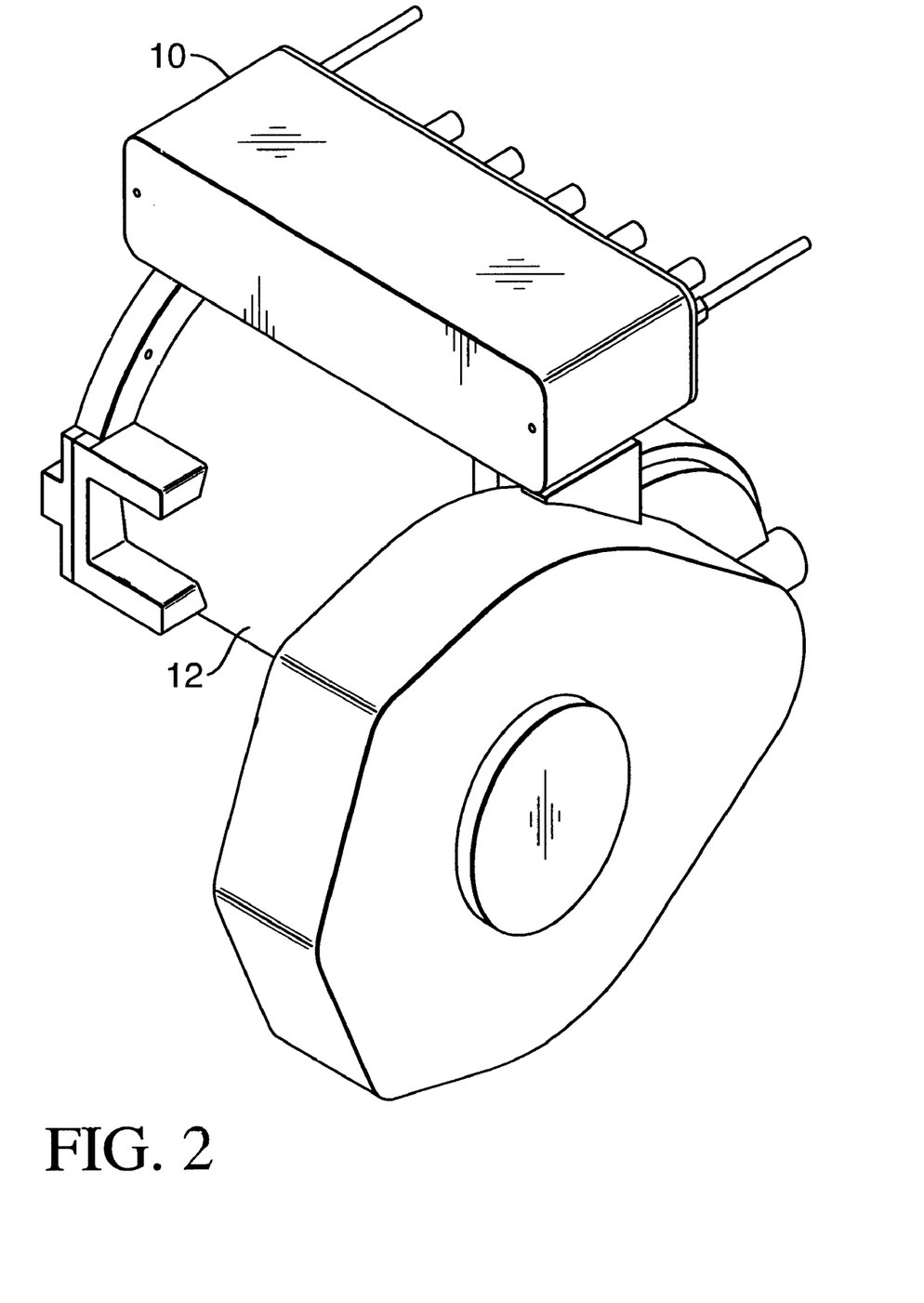
FIG. 2 shows the inverter mounted in the engine compartment of a vehicle.
Figure 3:
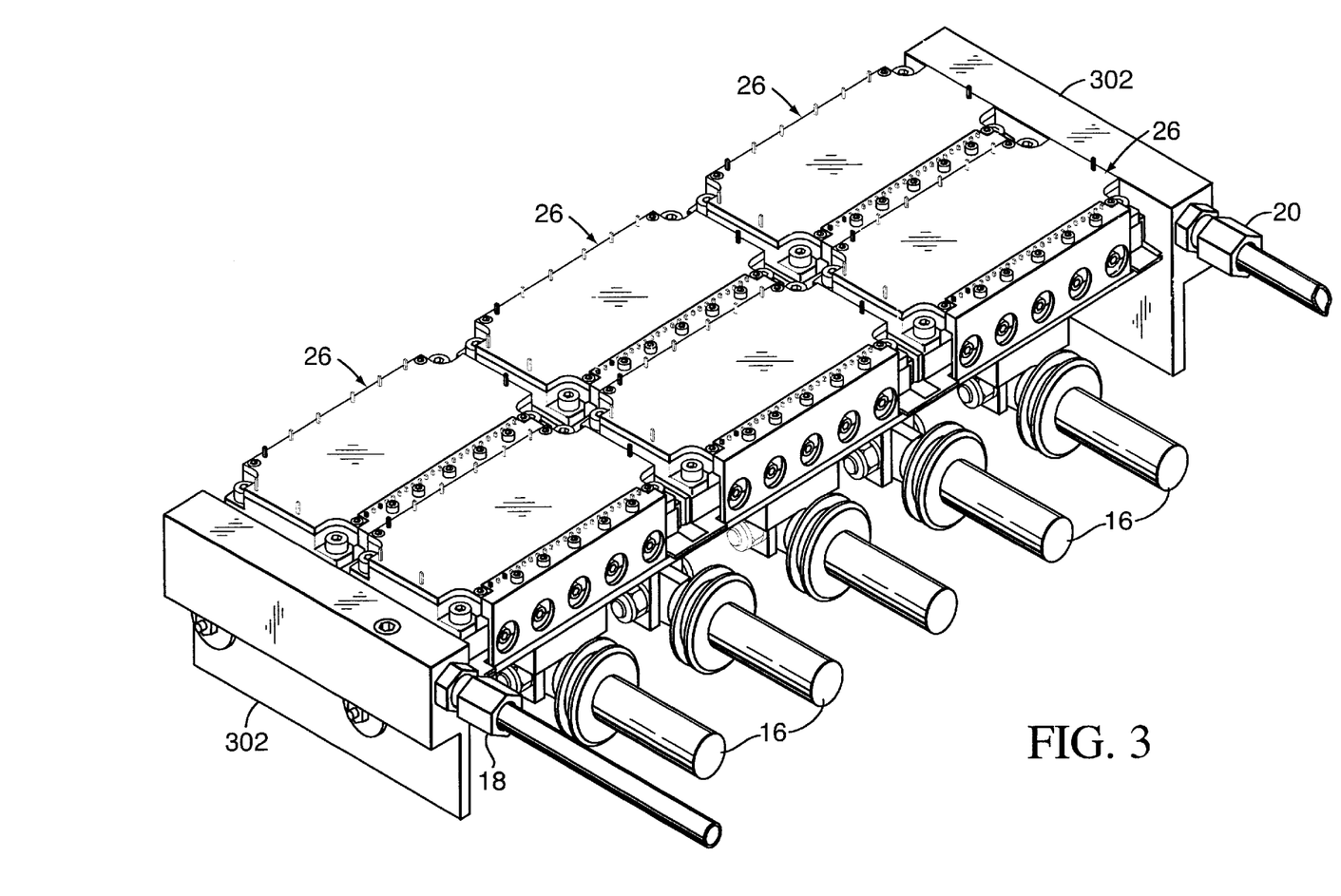
FIG. 3 is a top side perspective view of the inverter module with the module housing removed.
Figure 4:
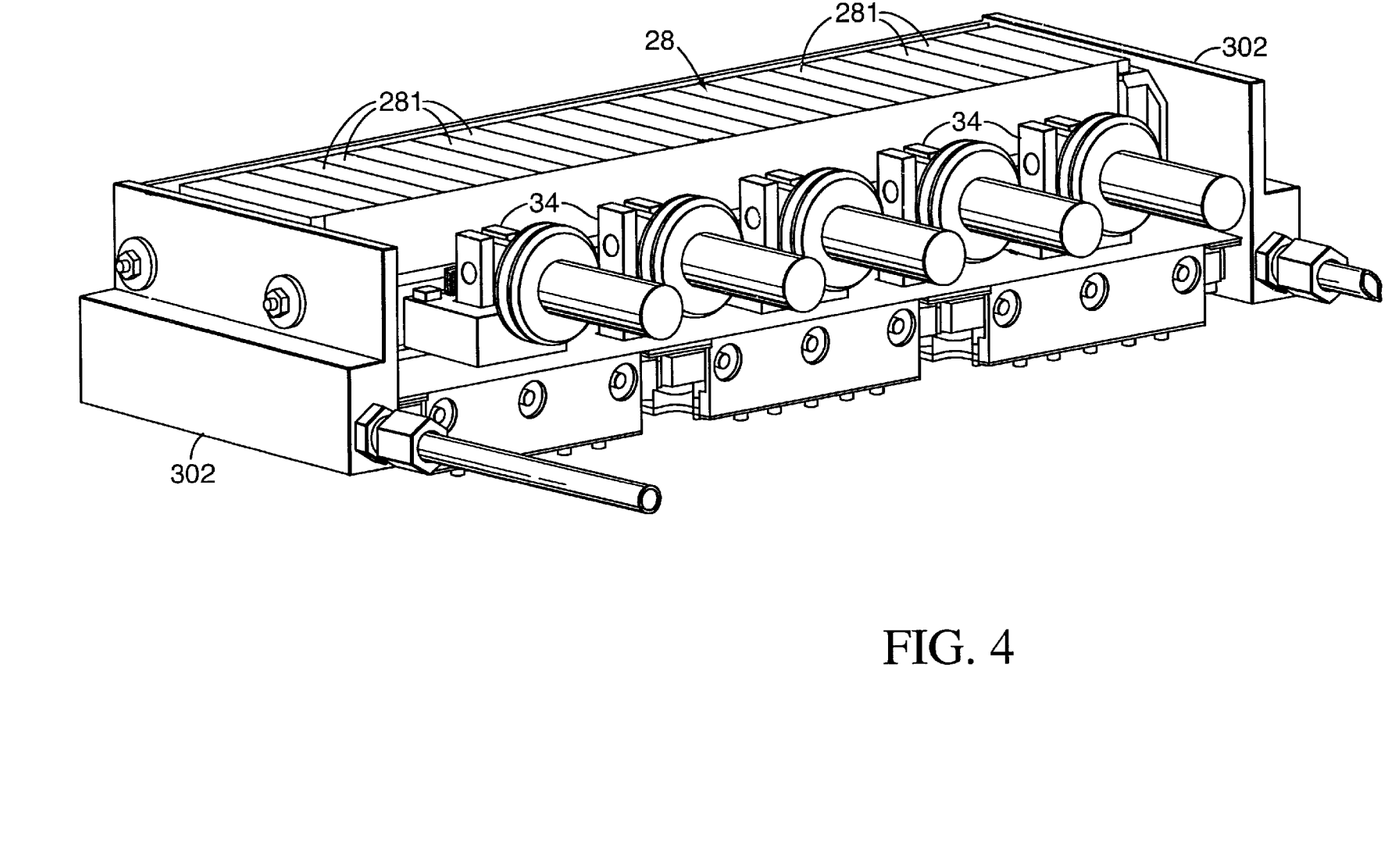
FIG. 4 is a bottom side perspective view of the inverter module with the module housing removed.

Referring first to FIGS. 1–4, the present invention is an inverter 10 for an electric traction motor. The inverter 10 is cooled with an oil-cooling system. The inverter 10 is installed in line with the oil-cooling system of the motor 12, so that no additional cooling system is required. Because of the compact design of the inverter 10, the inverter module can be mounted directly to the motor 12. FIG. 2 shows the inverter 10 mounted on the generator of the motor 12.

It can be seen that the inverter 10 comprises an external housing 14 that encloses the components of the inverter 10. The current output by the inverter 10 is accessed at multiple output terminals 16 which protrude from a front side of the inverter housing 10. The current output by the inverter 10 serves as the power source to drive the traction wheels of the vehicle.

The cooling fluid, hot oil from the motor 12, enters the inverter 10 through a coolant inlet port 18, and exits via a coolant outlet port 20. The oil flows through the heat sinks 22, which each have an IGBT switch 24 mounted on a top surface thereof. There are six IGBT switch/heat sink assemblies 26 utilized in the inverter 10. The six IGBT switches 24 are necessary to enable the inverter 10 to provide 3-phase AC current as its output. A capacitor bank 28 is included in the inverter to provide a storage mechanism that provides a pulsing means for the inverter 10. The capacitor bank 28 comprises a plurality of capacitors 281 fixed side by side.

Figure 5:
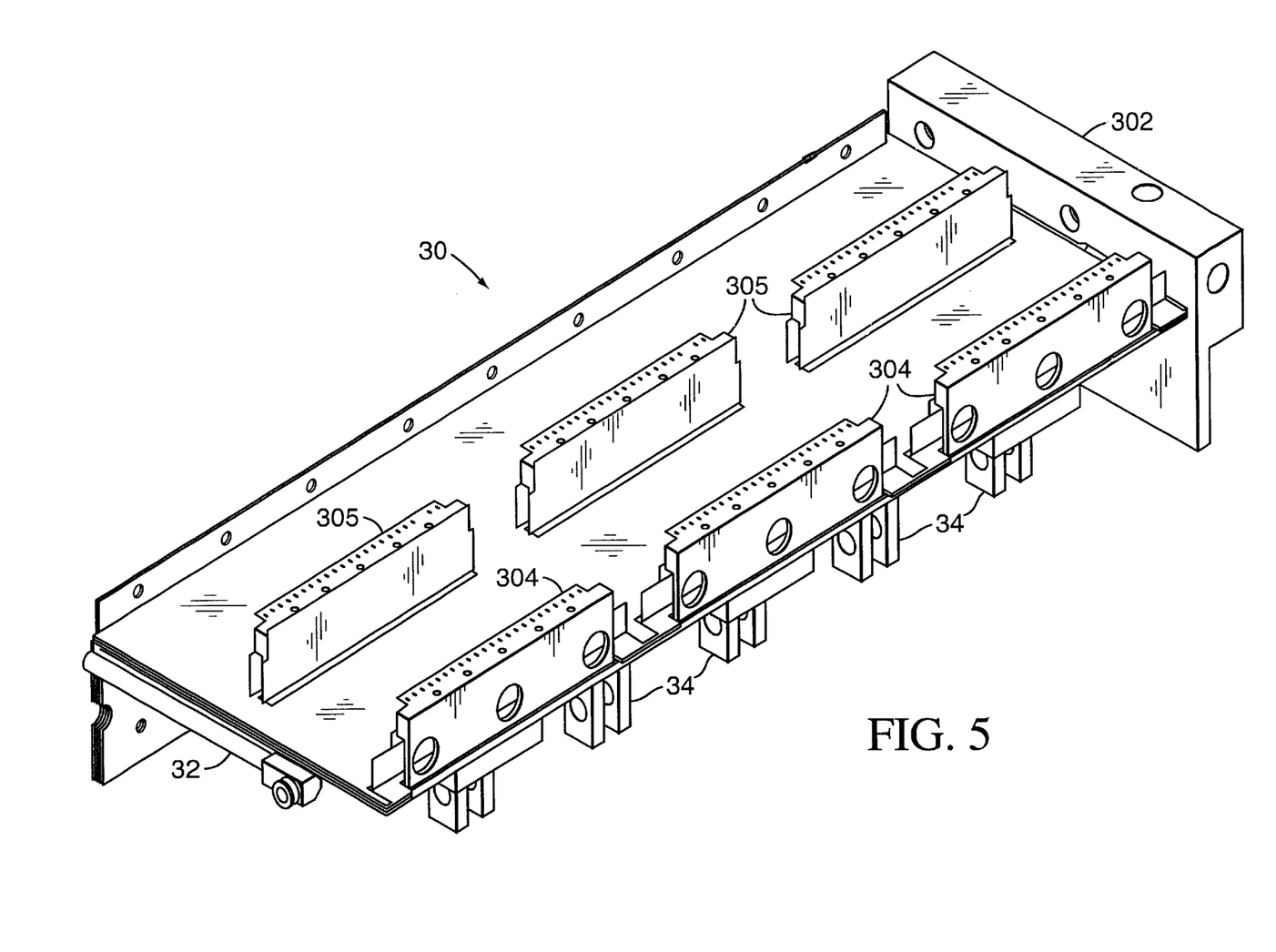
FIG. 5 shows a front perspective view of the laminated electrical bus structure with the cold plate in place and one end plate attached.
Figure 6:
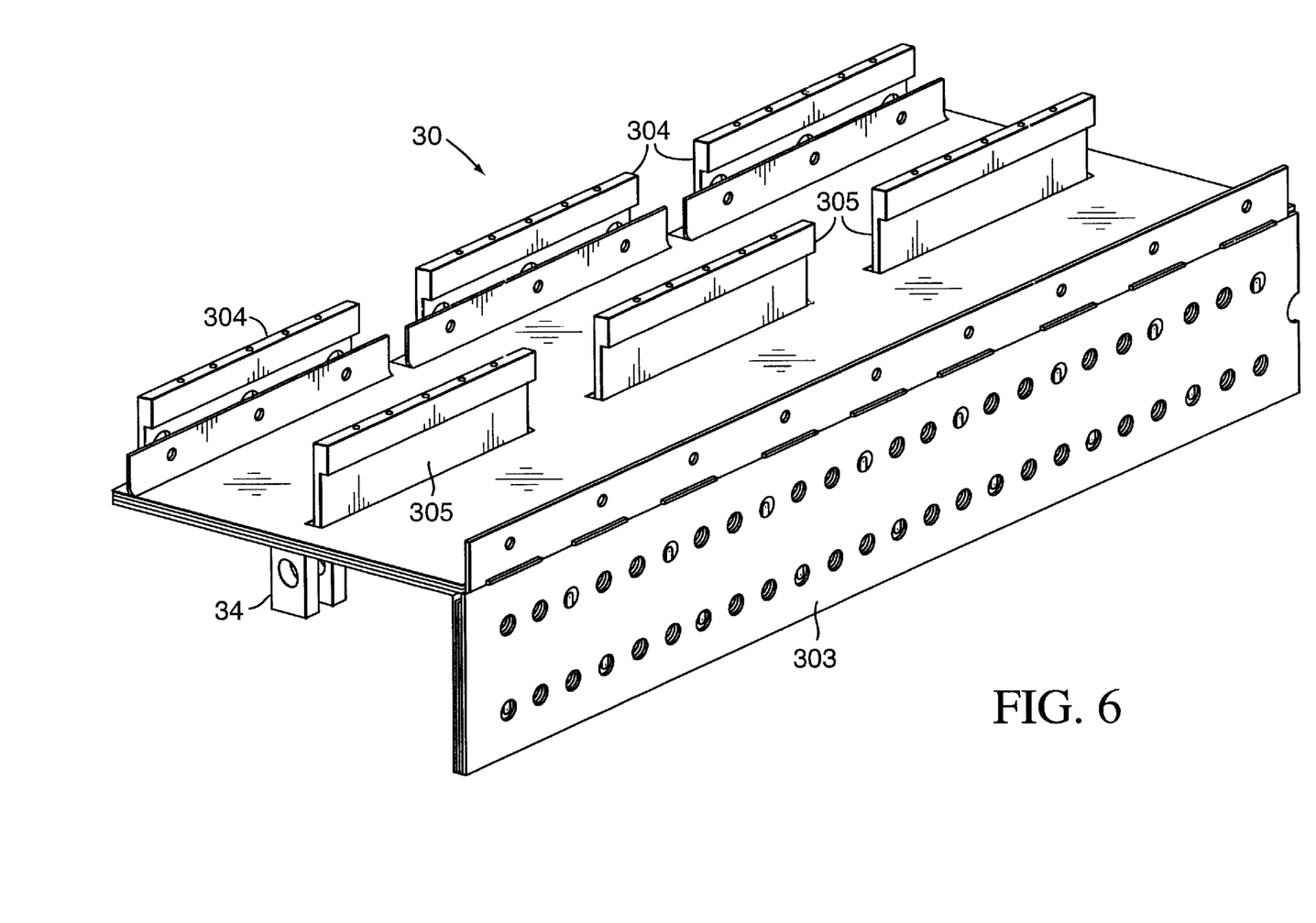
FIG. 6 shows a rear perspective view of the laminated electrical bus structure of the present invention.
Figure 7:
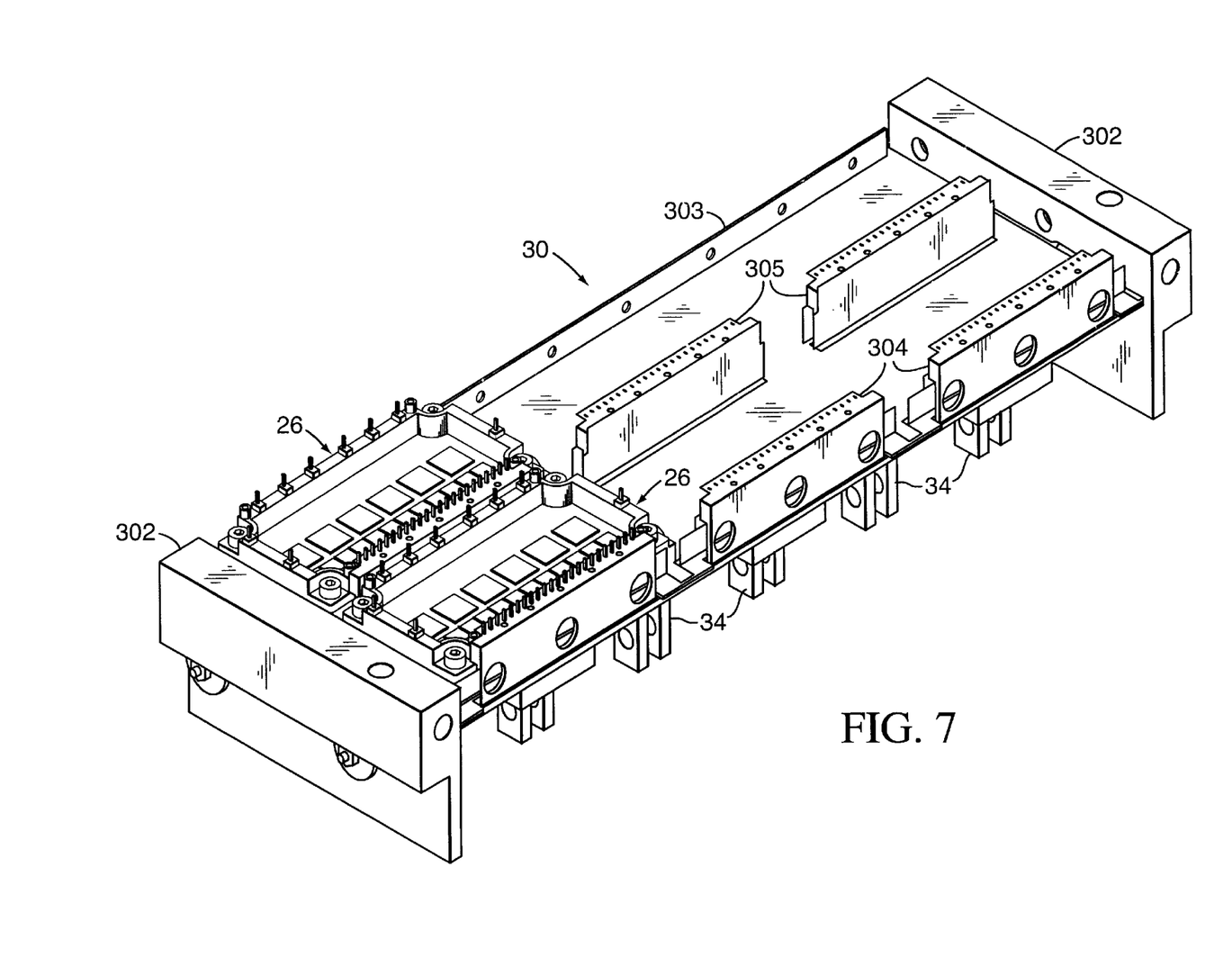
FIG. 7 shows the bus structure with two IGBT switch/heat sink assemblies mounted therein and the two end plates attached.
Figure 8:
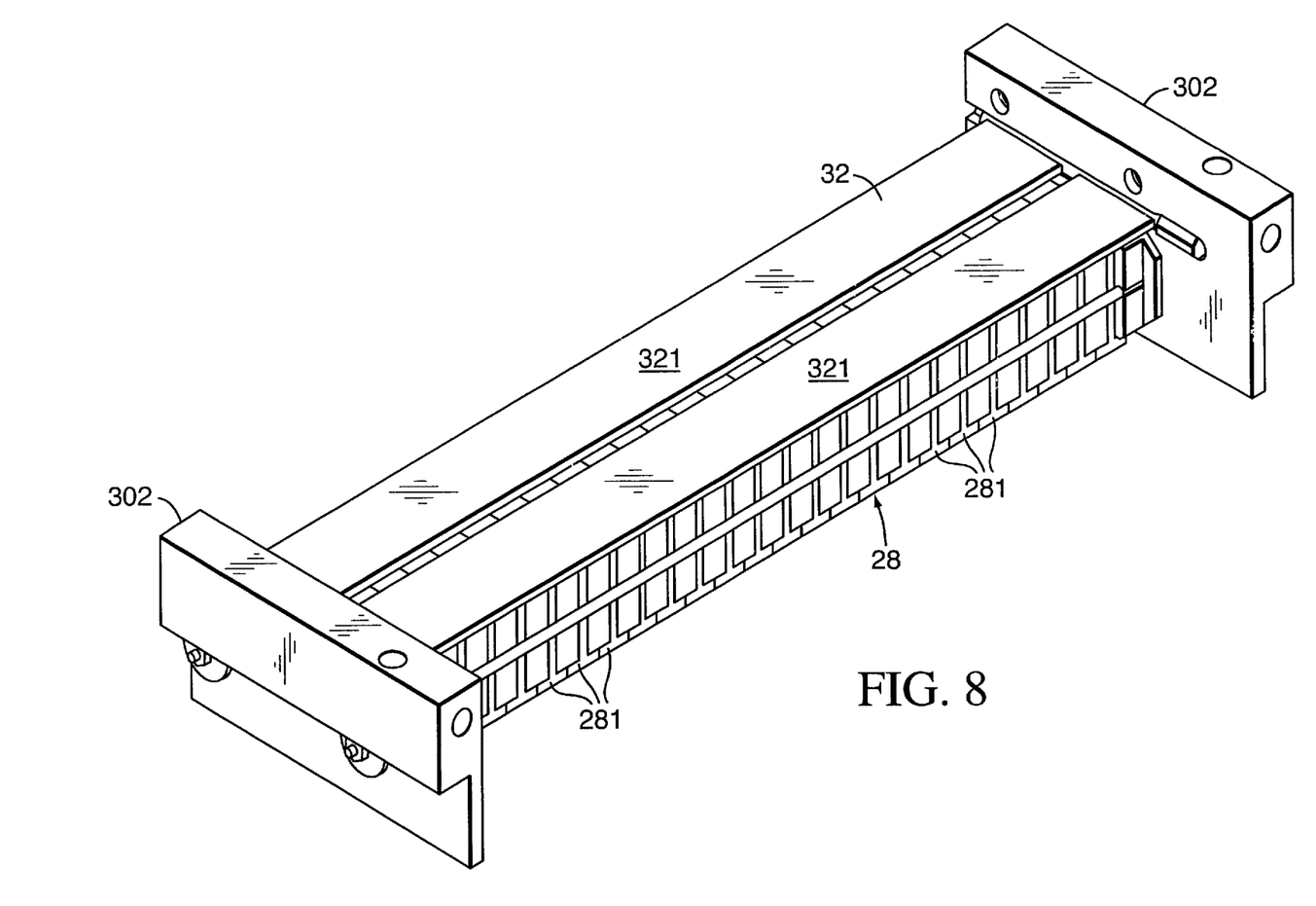
FIG. 8 depicts the capacitor bank of the inverter.

The IGBT switch/heat sink assemblies 26 and the capacitor bank 28 are mounted on a laminated bus device 30, illustrated in FIGS. 5–7. The bus device 30 comprises a planar central body 301 secured between two end plates 302. The six IGBT switch/heat sink assemblies 26 are mounted on an upper surface of the central body 301 of the bus device 30. The capacitor bank 28 is mounted on a rear side of a lower surface of the central body 301 of the bus 30. The capacitor bank 28, as shown in FIG. 8, comprises a plurality of capacitors 281 fixed side by side in mounting brackets 282.

Figure 9:
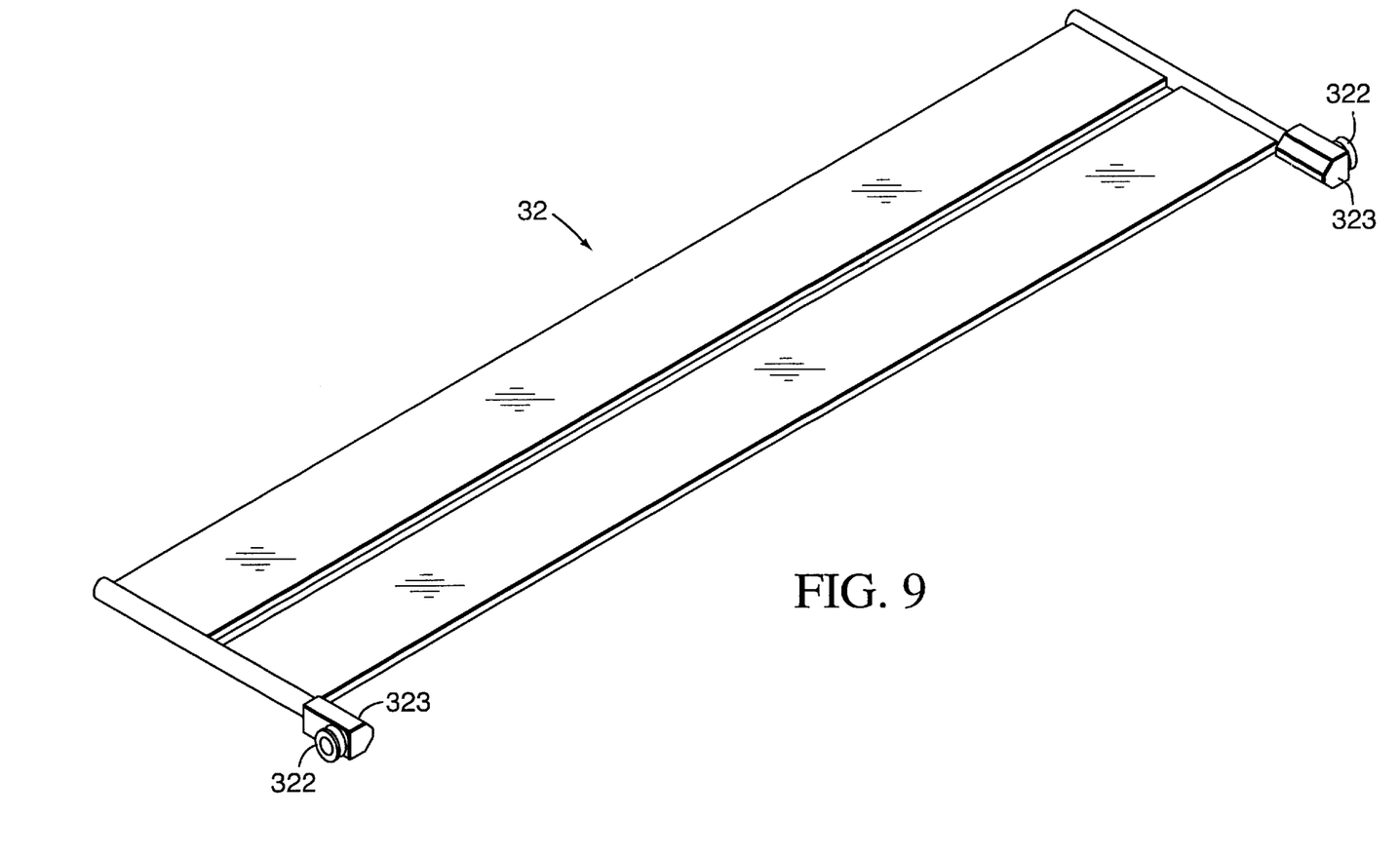
FIG. 9 shows a perspective view of the cold plate upon which the capacitor bank rests in the module.

A capacitor cold plate 32, FIG. 9, is sandwiched between the capacitor bank 28 and the bus 30 to remove heat from the capacitor bank 28. The capacitor cold plate 32, like the heat sinks 22, utilizes coolant (oil) from the motor of the vehicle. A coolant inlet port 322 and a coolant outlet port 323 are provided on the cold plate 32.

The front side of the lower surface of the central body 301 serves as a mounting means for a plurality of output brackets 34. The output brackets 34 are simply heavy, electrically conductive elements that serve to convey the current produced from the inverter 10 to the output terminals 16. Lead wires from the traction wheels of the vehicle are then affixed to the output terminals 16.

On the upper surface of the bus 30, a contact bar extending upward from a first side of the central body 301 comprises an upper portion of a positive bus 303. The positive bus 303 also extends downward behind the central body 301 to provide a contact area for the capacitor bank 28. A plurality of raised contact bars extending upward from the front side of the central body 301 comprise a negative bus 304. A plurality of raised contact bars in a center portion of the central body 301 comprise an output connecter bus 305.

Figure 10:
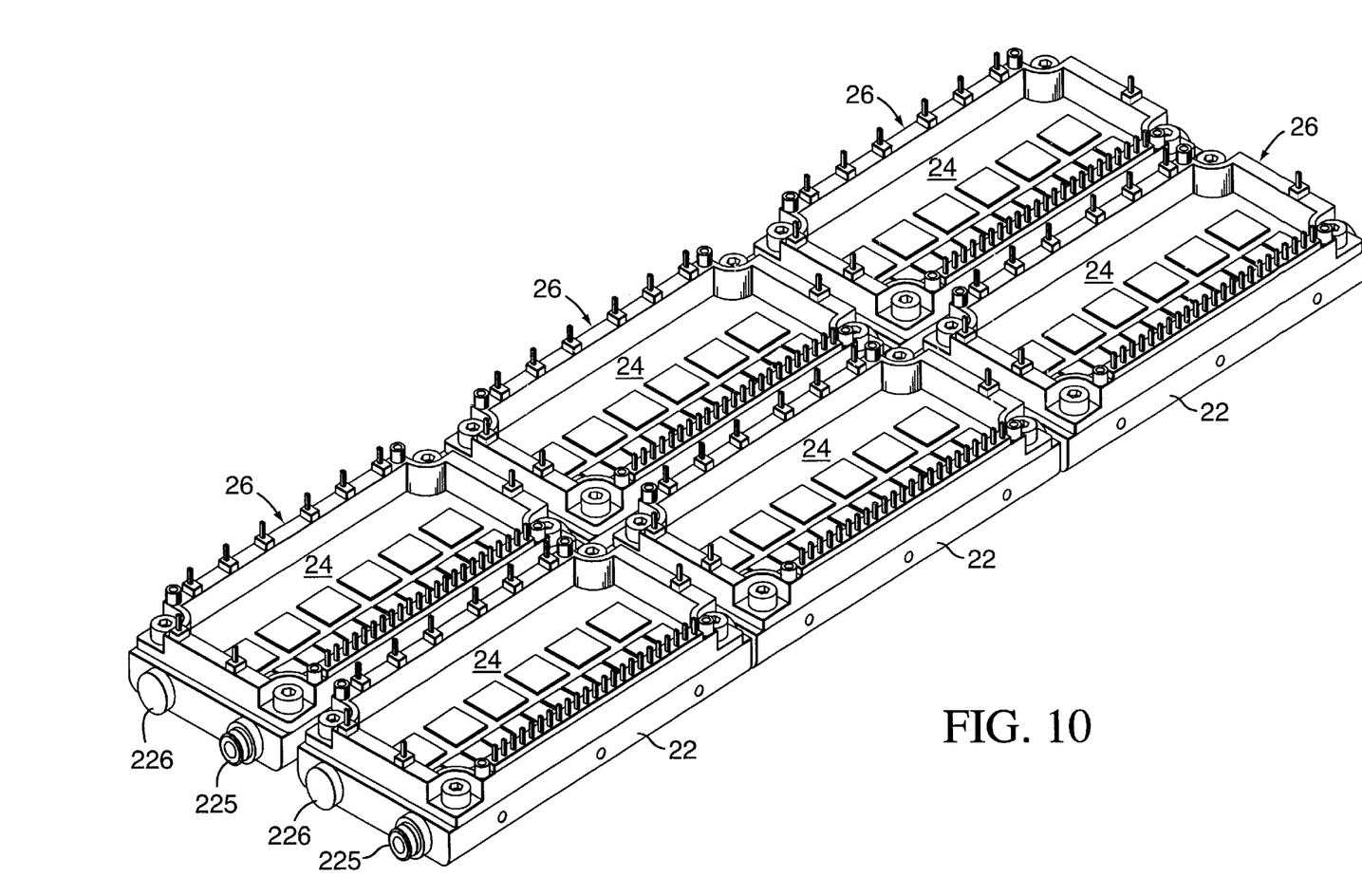
FIG. 10 shows the full set of IGBT switches mounted on the heat sinks.
Figure 11:
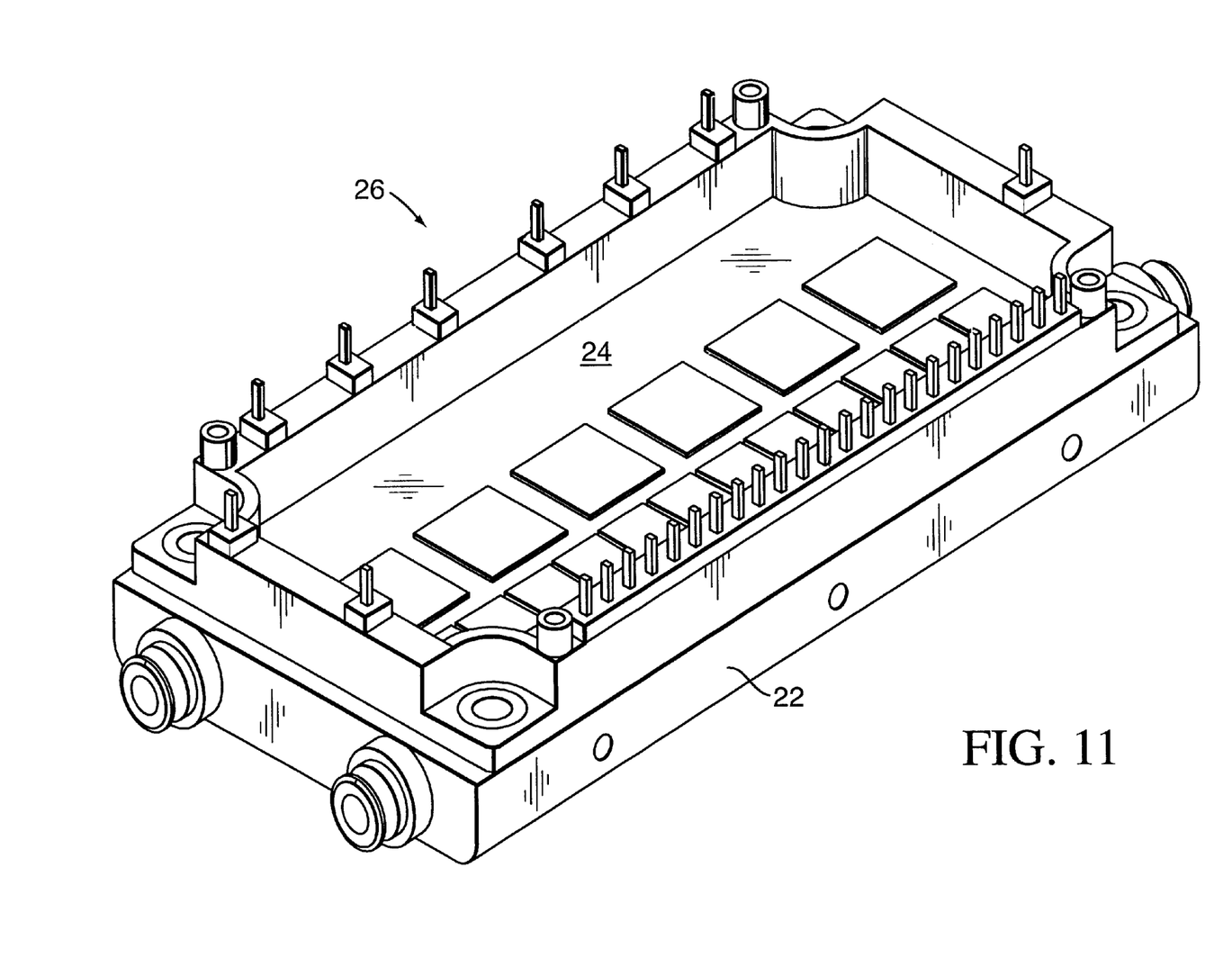
FIG. 11 shows a perspective view of a single IGBT switch/heat sink assembly.
Figure 12:
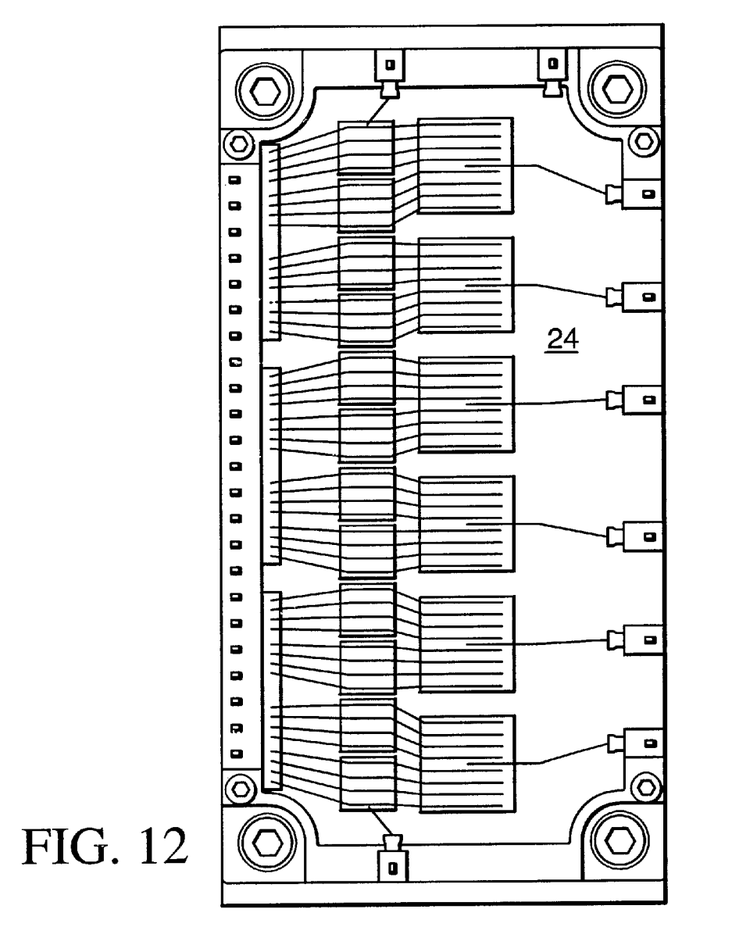
FIG. 12 is a top view of the IGBT switch with the cover removed for clarity.
Figure 13:
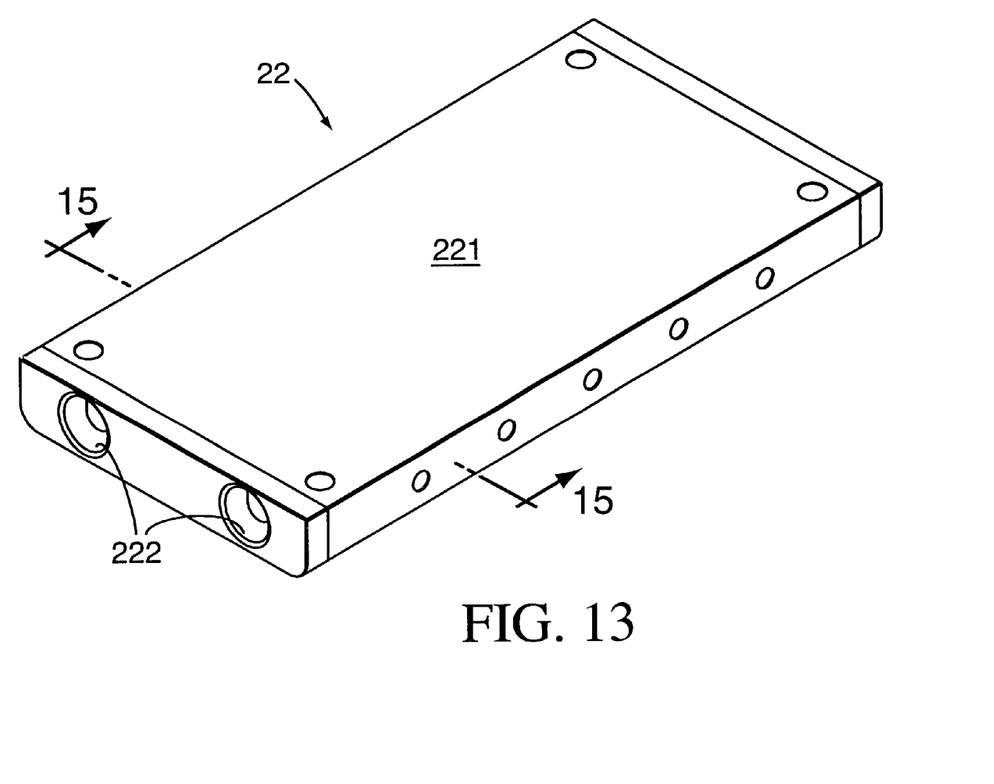
FIG. 13 is a perspective view of a heat sink.

The raised portions of bus strips 303, 304, 305 form a pair of longitudinal mounting channels. Each of the channels is used to securely mount three IGBT switch/heat sink assemblies 26, so that the six IGBT switch/heat sink assemblies 26 are aligned in two rows. The positive bus 303 and the output connecter bus 305 form a first channel 306 that contains a first row of three IGBT switch/heat sink assemblies 261, 262, 263. The negative bus 304 and the output connecter bus 305 form a second channel 307 that contains a second row of three IGBT switch/heat sink assemblies 26. The first row of the IGBT switches 24 activates the positive segment, in 120° intervals, of the AC current generated. The second row of IGBT switches 24 activates the negative segment, also in 120° intervals, of the AC current. FIG. 10 shows the two rows of IGBT switch/heat sink assemblies 26 assembled on their respective heat sinks 22. It should be noted that the structure of the bus device 30 allows the IGBT switch/heat sink assemblies 26 and the capacitor bank 28 to be assembled as generally flat, planar elements. This construction reduces the inductance present in the inverter 10, thereby allowing the IGBT switches 24 to operate more rapidly, which improves the overall performance of the inverter 10.

In terms of electrical operation, the inverter of the present invention is in most ways electrically equivalent to prior art inverters. One key exception is that the upper surface formed by the bank of heat sinks is electrically hot, and is used as part of the circuitry. This allows the elimination of the insulating plate on which the inverter circuitry is normally mounted, as the chips of the inverter circuitry of the present invention are mounted directly on the upper surface of the heat sinks of the inverter. The inverter of the present invention uses as its input a 600 volt DC potential generated by the motor. The output of the inverter of the present invention is 600 amp AC current.

Referring now chiefly to FIGS. 10–14, the IGBT switches 24 are mounted directly on an upper surface of the heat sinks 22. The upper surface of the heat sinks 22 is electrically hot, and serves as part of the inverter circuitry. The heat sink housing 221 is formed from nickel plated molybdenum, which has the same coefficient of thermal expansion as silicon. This means that the silicon substrate of the chips of the inverter circuitry will expand and contract at the same rate as the heat sink housing as the inverter heats and cools.

Figure 14:
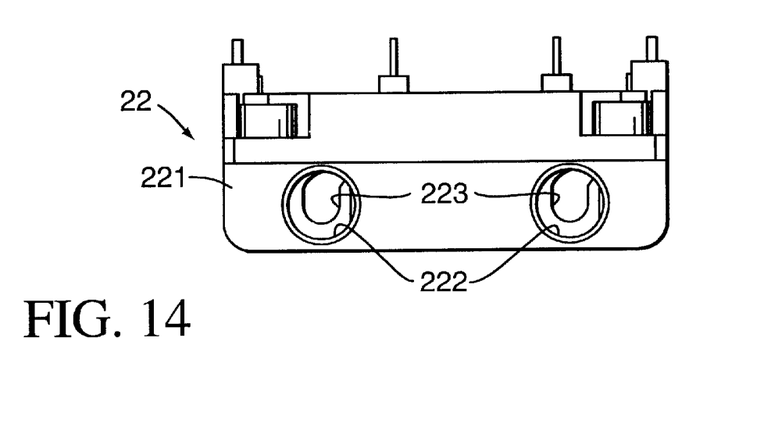
FIG. 14 is an end view of the heat sink showing the coolant channels.
Figure 15:
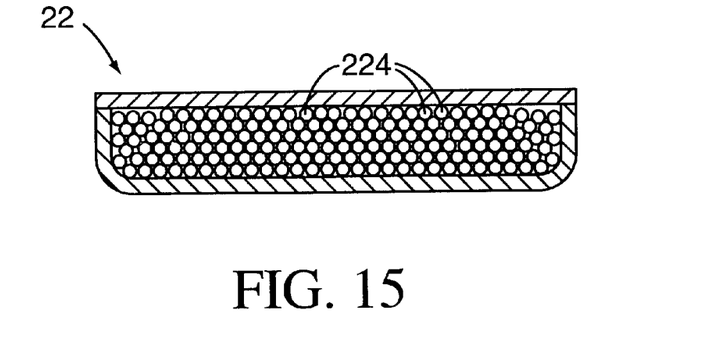
FIG. 15 is a broken view of the heat sink illustrating the internal coolant throughways and the heat transfer medium.

The heat sinks 22 include a pair of parallel coolant throughways 222 in their interiors. The throughways 222 each include an open section 223 on an upper inner side thereof. This allows a heat transfer fluid flowing in a first throughway 222 to spill over into the interior of the housing 221, and engulf a heat transfer medium 224. The fluid fills the interior of the heat sink 22, and flows into the open section 223 of the second throughway 222.

The heat transfer fluid enters the inverter 10 from the coolant supply port 18 through an upper supply side inlet port 225 on the heat sink 22 of the first in line IGBT switch/heat sink assemblies 261 of each of the rows of assemblies 26. The second supply side inlet port 226 of the first in line heat sinks are capped. The throughways 222 of the first in line heat sinks are connected to the throughways 222 of the second in line heat sinks, which are in turn connected to the throughways of the third in line heat sinks. The connections of the throughways are accomplished by using known rubber connectors. On the outlet end of the inverter 10, the lower throughway openings of the third in line heat sinks are open, and the upper openings are capped.

The heat transfer fluid thus enters each row of heat sinks from an upper inlet side, flows through the row, and flows out of the third in line heat sinks at a lower outlet side. As the heat transfer fluid flows through and around the heat transfer medium 224, heat conveyed into the heat transfer medium 224 from the IGBT switches 22 is removed by the heat transfer fluid.

In the preferred embodiment, the heat transfer fluid is motor oil, and the heat transfer medium 224 is a plurality of silver plated copper balls. The copper balls 224 are brazed to each other and to the walls of the heat sinks 22 in a unique assembly process. The spherical shape of the balls provides an excellent means of creating contact from each ball 224 with a plurality of other balls 224 and with the interior walls of the heat sink housing 221. This creates a superior heat transfer path in the heat sinks 22. The flow paths created between the balls 224 have smooth boundaries and are relatively large. Free flow through the heat transfer medium is critical so that debris from the motor oil does not become trapped in the interior of the housing 221.

The heat sinks 22 are formed as follows: Approximately 3/32" diameter balls 224 are packed together in the interior of the heat sink housing. The balls 224 have to be bonded to each other and to the manifold with a maximum bond contact area in order to allow for optimal heat conduction. The metallurgical bonding between the balls 224 is achieved by first plating a brazing compound on the balls. The key consideration in the plating process is to provide a sufficient plating layer so that during a brazing cycle, a sufficient volume of liquified material is produced to provide wetting at contact points between the balls to increase the size of the conductive heat transfer paths.

It should be clear that many different materials and shapes can be chosen for the individual heat transfer media. However, in the preferred embodiment, a copper ball 224 is used. Because copper alloys are susceptible to hydrogen embrittlement, the composition of the balls must be controlled to allow for the thermal processing required during the brazing process. In the preferred embodiment, an OFHC (Oxygen Free High Conductivity) copper alloy ball is utilized.

The alloy must be free of contaminants to be properly bonded in the brazing process. For this reason, the commercially available copper balls are first chemical milled to remove a significant amount of material from the surface of the balls. The degree of material removal necessary is defined by the condition of the balls as purchased.

A copper-silver eutectic brazing compound is used to bond the balls together. The eutectic copper-silver alloy is produced by first plating silver onto the copper balls, and then thermally processing the resultant matrix to achieve the proper amount of liquification. In the preferred embodiment, the balls are prepared by electrodepositing a 0.5 mil thick layer of dull silver onto the copper balls.

After the balls have been silver plated, they are introduced into the interior of the heat sink housing. The housing is then secured in a brazing fixture. With an appropriate fixture, the brazing of the individual elements of the porous metal heat transfer medium and the securing of the manifolds to the heat sink housing can be performed concurrently. The following thermal cycling is used during the brazing process:

a) Heat to 1000±25° F. in 60 min.
b) Hold at 1000±25° F. for 20 min.
c) Heat to 1400±15° F. in 30 min.
d) Hold at 1400±15° F. for 20 min.
e) Heat to 1500±10° F. in 5 min.
f) Hold at 1500±10° F. for 10 min.
g) Furnace cool to 500° F.

The resultant heat sink is then ready for installation on the inverter.

Because one surface of the heat sink is used as a mounting area for the inverter circuitry, that surface must be relatively flat. Occasionally during the brazing process, the bonding of the balls to the wall of the housing causes excessive deformation of the housing. The amount of acceptable variance from flat will vary according to the specific application. If the brazing process takes the surface of the heat sink outside acceptable tolerances, additional processing is required.

The flatness of the heat sink wall can be restored by resurfacing and re-plating the wall. It has also been discovered that the flattening of the wall can be accomplished by a coining process. The coining process simply involves applying high pressure to the housing (a cold forming process) until the surface is brought within acceptable flatness limits.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

We claim:

1. An inverter for an electric motor comprising:

a switching means, a heat sink means associated with said switching means, a capacitance means, and DC to AC inverter circuitry; wherein said switching means and said DC to AC inverter circuitry enable said inverter to receive DC voltage as an input and to output 3-phase AC current, chips of said inverter circuitry and said switching means are mounted directly on a top surface of said heat sink means, and said heat sink means comprises a housing with at least one heat transfer liquid throughway in an interior of said heat sink housing, at least an input and an outlet port for heat transfer liquid, such that said heat transfer liquid flows through said heat sink means to dissipate heat from said switching means, and an interior heat transfer medium, said heat transfer medium comprising a plurality of metallic spheres thermally connected to each other and to an interior surface of said heat sink housing, such that a spaced lattice structure is formed.

2. The inverter of claim 1 wherein:

said heat sink means is installed in line with an oil cooling system of a motor utilizing said inverter.

3. The inverter of claim 1 wherein:

said metallic spheres are silver plated copper balls.

4. The inverter of claim 1 wherein:

said heat transfer liquid throughway comprises a pair of parallel channels, each said channel having an open portion on an upper inner side thereof, such that said heat transfer liquid fills said channels and spills into an interior of said heat sink means, thereby surrounding a heat transfer medium contained in an interior of said heat sink means.

5. The inverter of claim 1 wherein:

said heat sink means is constructed with a flat elongated geometry.

6. The inverter of claim 1 wherein:

said switching means, said heat sink means, said capacitance means, and said DC to AC inverter circuitry are installed in a bus structure, said bus structure securing said switching means, said heat sink means, said capacitance means, and said DC to AC inverter circuitry in a flat elongated conformation such that inductance of said inverter is decreased.

7. The inverter of claim 1 wherein:

said switching means comprises six switches, each said switch being mounted on an independent heat sink means element.

8. The inverter of claim 7 wherein:

said heat sink means elements are aligned in two rows, each said row including three of said heat sink means elements.

9. The inverter of claim 8 wherein:

each of said heat sink means elements in each said row is in communication with an adjacent heat sink means element, such that liquid can flow from a first heat sink means element in a row, through a second heat sink means element in said row, and through a third heat sink means element in said row.

* * * * *

UNITED STATES PATENT AND TRADEMARK OFFICE
CERTIFICATE OF CORRECTION

PATENT NO.     : 6,529,394 B1
DATED          : March 4, 2003
INVENTOR(S)    : Craig Joseph and Kelly W. Arnold It is certified that error appears in the above-identified patent and that said Letters Patent is hereby corrected as shown below:

<u>Title page,</u>
Item [56], References Cited, U.S. PATENT DOCUMENTS, please add the following reference:
-- 6,201,365 A * 3/2001  Hara et al.........318/558 --

Signed and Sealed this

Fourteenth Day of December, 2004

JON W. DUDAS
*Director of the United States Patent and Trademark Office*